United States Patent
Jain et al.

(10) Patent No.: US 8,904,324 B2
(45) Date of Patent: Dec. 2, 2014

(54) PARAMETERIZED CELL FOR PLANAR AND FINFET TECHNOLOGY DESIGN

(71) Applicant: GLOBALFOUNDRIES Inc., Grand Cayman (KY)

(72) Inventors: Navneet Jain, Sunnyvale, CA (US); Paul D. Mesa, Sunnyvale, CA (US); Qinglei Wang, San Jose, CA (US); Qi Xiang, Sunnyvale, CA (US); Mahbub Rashed, Cupertino, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/836,057

(22) Filed: Mar. 15, 2013

(65) Prior Publication Data
US 2014/0282323 A1  Sep. 18, 2014

(51) Int. Cl.
*G06F 17/50* (2006.01)

(52) U.S. Cl.
CPC .................................. *G06F 17/5068* (2013.01)
USPC ........................................................ 716/110

(58) Field of Classification Search
USPC ........................................................ 716/110
See application file for complete search history.

(56) References Cited

U.S. PATENT DOCUMENTS

| | | | |
|---|---|---|---|
| 2011/0283245 A1* | 11/2011 | Shen et al. ..................... | 716/106 |
| 2013/0134513 A1* | 5/2013 | Standaert et al. ............. | 257/347 |
| 2013/0334610 A1* | 12/2013 | Moroz et al. .................. | 257/369 |
| 2013/0334613 A1* | 12/2013 | Moroz .......................... | 257/401 |

FOREIGN PATENT DOCUMENTS

JP      2013033610 A  *  2/2013

* cited by examiner

*Primary Examiner* — Vuthe Siek
*Assistant Examiner* — Mohammed Alam
(74) *Attorney, Agent, or Firm* — Darrell L. Pogue; Keohane & D'Alessandro, PLLC

(57) ABSTRACT

A parameterized cell for planar and finFET designs is provided. A parameterized cell (Pcell) describing a planar design is integrated with fin-based design criteria, including fin pitch. For material regions in a planar design that have a corresponding region in a fin design, a quantized value based on the fin pitch is computed. The material can include regions such as active area silicon, contact regions, and local interconnect regions.

14 Claims, 7 Drawing Sheets

PARAMETERIZED CELL FOR PLANAR AND FINFET TECHNOLOGY DESIGN

FIELD OF THE INVENTION

The present invention relates generally to semiconductors and, more particularly, to methods, systems, and structures for semiconductor design.

BACKGROUND

A process of designing an integrated circuit (IC) comprises multiple steps. Building blocks of the IC under design are typically represented by parameterized cells (Pcells). During a schematic (netlist) stage, the Pcell is a symbolic representation of an electronic entity. During a layout stage, a user application generates a request to evaluate the Pcell by passing parameter values and identity of the Pcell desired. The request results in generation of an instantiation of a physical, fixed structure of the Pcell. This structure is referred to as design data and is compatible with an electronic design automation (EDA) vendor's database.

With the continuing trend towards miniaturization of integrated circuits (ICs), there is a need for transistors to have higher drive currents with increasingly smaller dimensions. Fin field effect transistor (finFET) technology is becoming more prevalent as device size continues to shrink and, in some cases, is used to implement designs previously implemented with planar technology. There are many existing designs implemented in planar technology, and new designs are continuing to be developed. Adapting planar designs to finFET technology is more than simply accounting for a different critical dimension. As finFET technology represents a new paradigm compared to planar technology, there are numerous issues that can complicate the migration from planar technology to finFET technology.

SUMMARY OF THE INVENTION

In general, embodiments of the invention provide a design methodology that simplifies the adapting of a planar design to a fin-based design. A parameterized cell (Pcell) describing a planar design is integrated with fin-based design criteria, including fin pitch. For material regions in a planar design that have a corresponding region in a fin design, a quantized value based on the fin pitch is computed. The material regions may include, but are not limited to, active area silicon, contact regions, and local interconnect regions.

A first aspect of the present invention includes a method for adapting a planar design to a fin-based design, comprising: receiving width information for a planar region; receiving a fin pitch value; and computing a quantized region width for a quantized region, based on the fin pitch value.

A second aspect of the present invention includes a system for implementing a parameterized cell, comprising one or more processors coupled to non-transitory memory containing machine instructions, that when executed by the one or more processors, perform the functions of: receiving width information for a planar region; receiving a fin pitch value; and computing a quantized region width for a quantized region, based on the fin pitch value A third aspect of the present invention includes a computer program product embodied in a non-transitory computer-readable medium for adapting a planar design to a fin-based design comprising: instructions for receiving width information for a planar region; instructions for receiving a fin pitch value; and instructions for computing a quantized region width for a quantized region, based on the fin pitch value.

BRIEF DESCRIPTION OF THE DRAWINGS

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity. Furthermore, for clarity, some reference numbers may be omitted in certain drawings.

Features of this invention will be more readily understood from the following detailed description of the various aspects of the invention taken in conjunction with the accompanying drawings in which.

DETAILED DESCRIPTION

Exemplary embodiments will now be described more fully herein with reference to the accompanying drawings, in which exemplary embodiments are shown. Exemplary embodiments of the invention provide a design methodology that simplifies the adapting of a planar design to a fin-based design. A parameterized cell (Pcell) describing a planar design is integrated with fin-based design criteria, including fin pitch. For material regions in a planar design that have a corresponding region in a fin design, a quantized value based on the fin pitch is computed. The material regions may include, but are not limited to, active area silicon, contact regions and local interconnect regions. A graphical display of an overlay between a planar design and a fin-based design may be provided to a user.

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer), is present on a second element, such as a second structure (e.g. a second layer), wherein intervening elements, such as an interface structure (e.g. interface layer), may be present between the first element and the second element.

Figure 1:
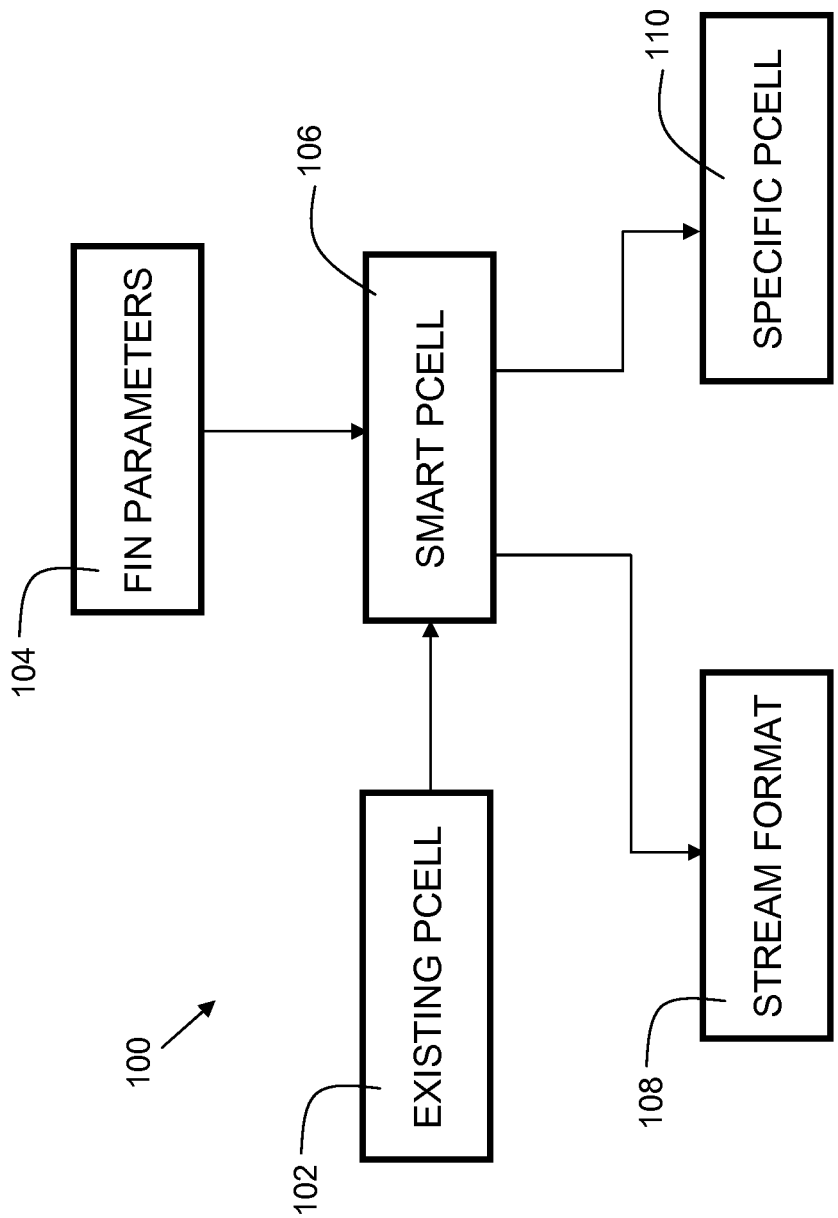
FIG. 1 is a block diagram indicating data flow in accordance with illustrative embodiments.

FIG. 1 is a block diagram 100 indicating data flow in accordance with illustrative embodiments. The data flow may begin with an existing Pcell 102 imported into a system in accordance with illustrative embodiments. The existing Pcell 102 may be for a planar design (a design utilizing planar transistors). Fin parameters 104 may be imported or entered, which include parameters pertinent to fin-based designs (designs utilizing finFETs), such as fin pitch. A "smart" Pcell 106 is then formed, which contains information needed to implement a planar design or a fin-based design. The smart Pcell 106 may then be used to generate data in a stream format 108 (e.g. GDSII or OASIS), or to generate a specific Pcell 110 for a particular design technology.

One of the key differences between fin-based designs and planar designs is in terms of device width. While a planar device can theoretically be of any width, finFETs are constrained to multiples of fin pitch (the distance from an edge of one fin to the corresponding edge of a neighboring fin). In an example, consider a planar device that has a device width W of 100 nanometers. If it is desired to convert the design of the planar device to a fin-based design where the fin pitch is 48 nanometers, then the closest width possible is 48×2=96 nanometers. That is, the planar device width W of 100 nanometers is converted to a quantized device width $W_Q$ of 96 nanometers. In addition to computing a quantized active area width, the position of the quantized active area may be computed to ensure the active area properly aligns with fins, contacts, and local interconnects, where applicable.

Figure 2:
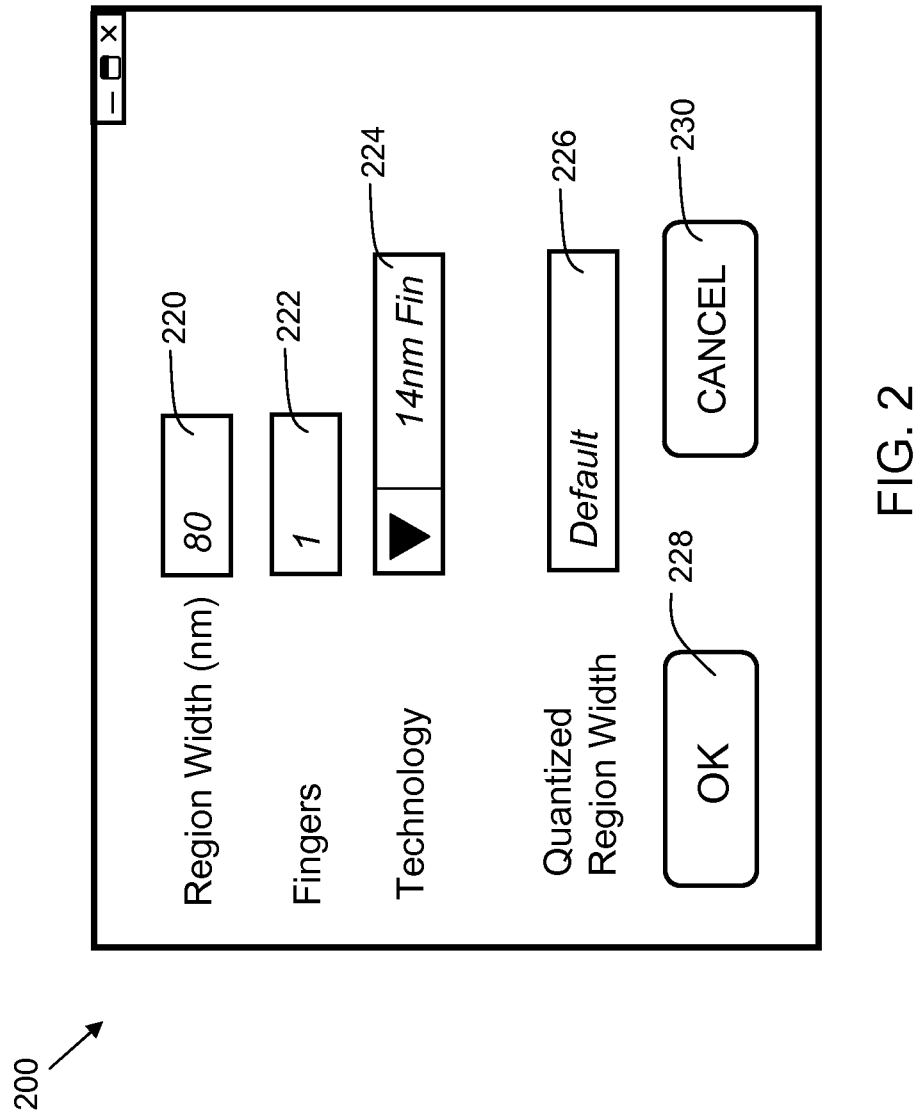
FIG. 2 is an exemplary data entry dialog box in accordance with illustrative embodiments.

FIG. 2 is an exemplary data entry dialog box 200 in accordance with illustrative embodiments. A region width data field 220 allows input of a desired region width (e.g., an active silicon area (RX) width). A fingers data field 222 allows input of the number of "fingers," or polysilicon lines which are present in a given circuit or pattern. A technology selection control 224 allows selecting a desired output technology. In one embodiment, available technologies (design types) include "20 nm planar" and 14 nm fin." The selection control 224 may be implemented with any suitable mechanism to enable selection, including, but not limited to, a drop-down list, radio buttons, checkboxes, or a text entry field. Quantized region width data field 226 allows input of a desired quantized region width minimum value. In some embodiments, a string "default" or a value of zero may be entered to indicate use of a default quantized region width. In other cases, a desired quantized region width minimum value may be entered. Referring again to the previous example, if a user entered a value of 115 nanometers in the quantized region width field 226, then the closest quantized width that exceeds 115 nanometers is 48×3=144 nanometers is used as the quantized width. In this way, a designer can override default settings where applicable to ensure certain region sizes are achieved. An OK button 228 may be used to accept the entered data. A cancel button 230 may be used to close the dialog box 200 without accepting the entered data.

Figure 3:
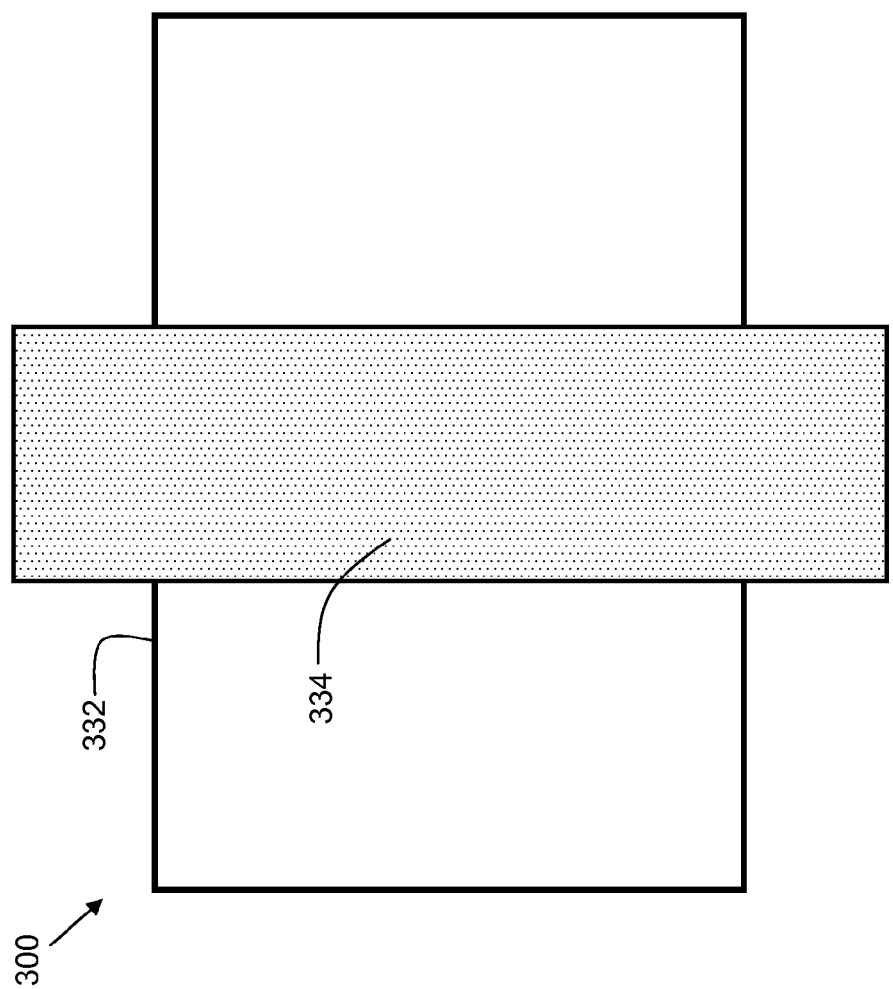
FIG. 3 is an exemplary planar design view in accordance with illustrative embodiments.

FIG. 3 is an exemplary planar design view 300 in accordance with illustrative embodiments. A polysilicon line, or "finger" 334 is shown overlaid on an active area silicon region 332. Planar design view 300 may be rendered on a system display, and may be based on data from a Pcell instance based on smart Pcell 106 (FIG. 1).

Figure 4:
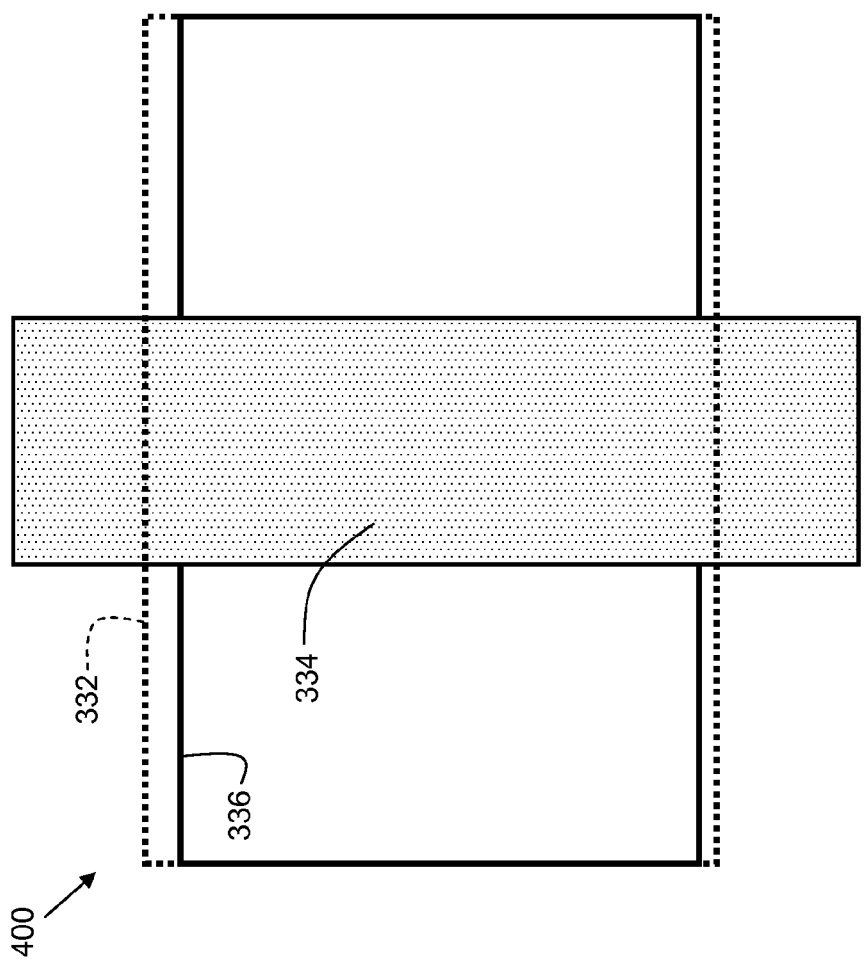
FIG. 4 is an exemplary design view of a planar design overlaid with a fin-based design in accordance with illustrative embodiments.

FIG. 4 is an exemplary design view 400 of a planar design overlaid with a fin-based design in accordance with illustrative embodiments. In design view 400, the active area silicon region 332 is shown in a dotted line, while a quantized active area 336, conforming to the fin pitch for a given fin technology node, is rendered in a solid line.

Figure 5:
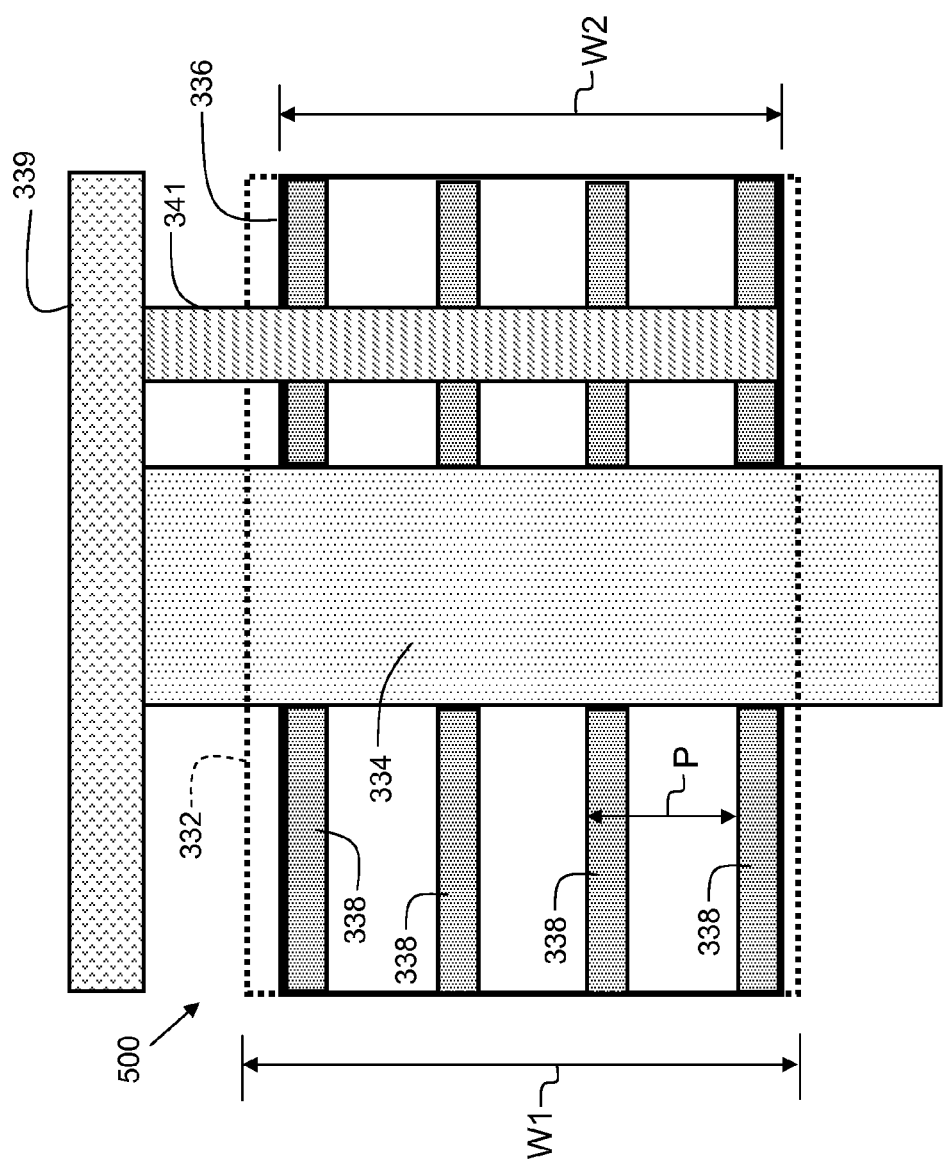
FIG. 5 is an exemplary design view showing fins in accordance with illustrative embodiments.

FIG. 5 is an exemplary design view 500 showing fins 338 in accordance with illustrative embodiments. The fins are spaced at a pitch P. In some embodiments, the pitch P may range from about 20 nanometers to about 60 nanometers, and may vary depending on the critical dimension (CD) of the technology in use. The quantized active area 336 has a width W2 that is a multiple of the fin pitch P, whereas the active area silicon region 332 corresponding to the planar device has a width W1. In many cases, W1 is greater than W2. Embodiments of the present invention may compute a quantized region width equivalent to the largest multiple of the fin pitch that is less than or equal to the planar region width. However, there are some cases where W2 is greater than W1 (e.g., where a quantized area (fin design) is larger than a corresponding non-quantized (planar design) area). Local interconnect 341 and metallization layer 339 may also be indicated. In some embodiments, a quantized local interconnect region width based on the fin pitch value may be computed and rendered in a manner similar to that described for the active area silicon.

In some cases, embodiments of the present invention may comprise software to compute a quantized area that is larger than the planar design area from which it was derived. Embodiments of the present invention may compute a quantized region width equivalent to the smallest multiple of the fin pitch that is greater than or equal to the planar region width. In some embodiments, a predetermined threshold may be used to determine when to generate a larger quantized area. In another example, consider a planar device that has a device width W of 100 nanometers. If it is desired to convert the design of the planar device to a fin-based design where the fin pitch is 51 nanometers, then the closest quantized width that is less than is 100 nanometers is 51 nanometers, or one fin pitch. However, a width based on two fin pitches is 51×2=104 nanometers, which is much closer to the planar design. Embodiments of the present invention may round to the nearest fin pitch multiple, regardless of whether it makes the quantized size greater than, or less than, the planar size. In other embodiments, a predetermined threshold may be used to determine if rounding to a larger fin pitch multiple is appropriate. For example, an embodiment may only round to a larger fin pitch multiple if the resulting quantized width is within 5 nanometers of the planar width.

In other embodiments, a warning may be presented to a user if the nearest fin multiple exceeds a predetermined value from the width of the planar design. In another example, consider a planar device that has a device width W of 100 nanometers. If it is desired to convert the design of the planar device to a fin-based design where the fin pitch is 41 nanometers, then the closest quantized width is 2×41=82 nanometers, which is 18 nanometers less than the planer device width of 100. A warning may be generated and presented to a user when the difference between the width of the planar design and the closest fin pitch multiple exceeds 10 nanometers. Hence, this example results in a warning being presented to the user. The warning alerts the user to a case where a close equivalent device width for a finFET may not be achievable for a particular planar device using a given technology (critical dimension).

Embodiments of the present invention are not limited to active silicon area, and may also be applied to other regions, including contact areas, and local interconnects. In some cases, regions may be similar between planar and fin-based designs. In other cases, a quantized equivalent region may be computed, and positioned as to properly align with fins or other semiconductor features.

Figure 6:
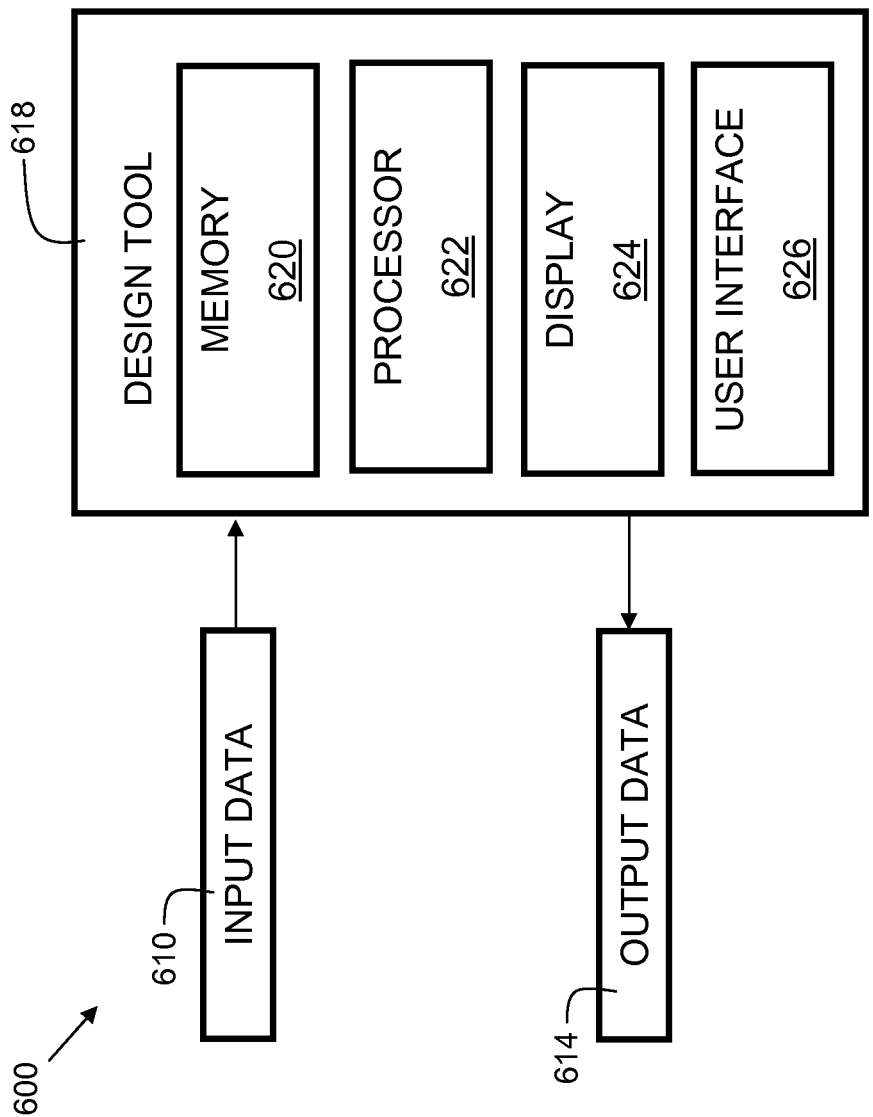
FIG. 6 is a block diagram of a system in accordance with illustrative embodiments.

FIG. 6 is a block diagram 600 of a system in accordance with illustrative embodiments. System 600 includes a design tool 618. Design tool 618 may be a computer comprising memory 620, and a processor 622 which is configured to read and write memory 620. In some embodiments, multiple processors or cores may be used. The memory 620 may be a non-transitory computer-readable medium, such as flash, ROM, non-volatile static ram, or other non-transitory memory. The memory 620 contains instructions that, when executed by processor 622, control the various subsystems to operate system 600. Design tool 618 may also include a display 624 and a user interface 626 for interacting with the system 600. The user interface 626 may include a keyboard, touch screen, mouse, or the like.

The design tool 618 may receive input data 610. Input data 610 may include a design structure, which may include a planar Pcell. The design structure may be a logical simulation design structure generated and processed by a design process to produce a logically equivalent functional representation of a hardware device. The design structure may also or alternatively include data and/or program instructions that when processed by design tool 618, generate a functional representation of the physical structure of a hardware device. The input data 610 may include hardware-description language (HDL) design entities or other data structures conforming to and/or compatible with lower-level HDL design languages such as Verilog and VHDL, and/or higher level design languages such as C, C++, Python, or SKILL. Embodiments of the present invention may further include a computer program product embodied in a non-transitory computer-readable medium.

The design tool 618 may generate output data 614. The generated output data 614 may be in a stream format indicative of a fin-based design. The output data may reside in a storage medium in a data format used for the exchange of layout data of integrated circuits (e.g. information stored in a GDSII (GDS2), GL1, OASIS, Pcell, or any other suitable format for storing such design structures). Output data 614 may include information such as, for example, additional Pcells, test data files, design content files, manufacturing data, layout parameters, wires, middle of line (MOL) interconnect information, levels of metal, vias, shapes, data for routing through the manufacturing line, and any other data required by a semiconductor manufacturer to produce embodiments of the present invention.

Figure 7:
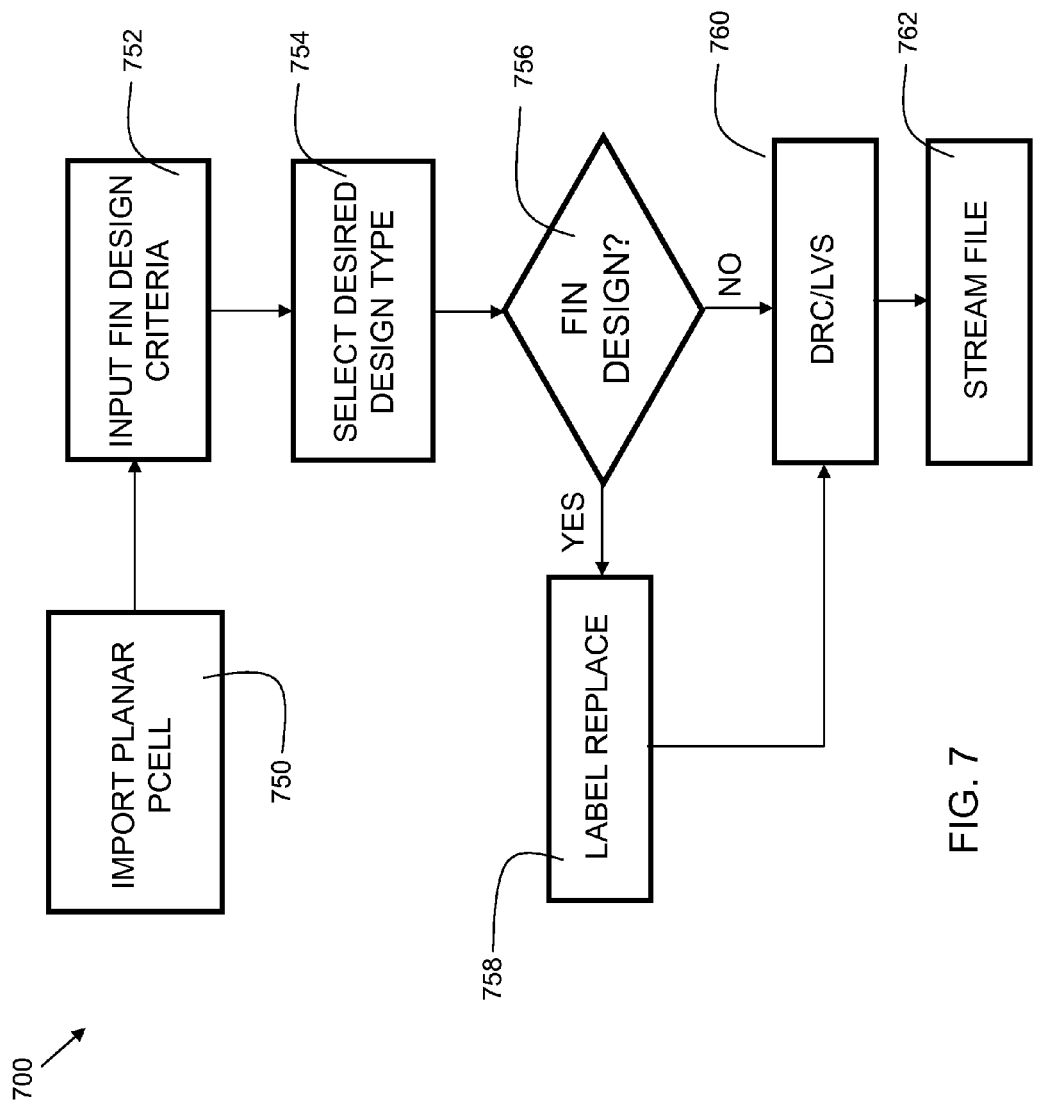
FIG. 7 is a flowchart in accordance with illustrative embodiments.

FIG. 7 is a flowchart 700 in accordance with illustrative embodiments. In process step 750, a planar Pcell file is imported or obtained. In process step 752, fin design criteria is input or received. The fin design criteria may include, but is not limited to, fin pitch and number of fingers. In process step 754, a desired design type is selected (e.g. 14 nanometer finFET). In process step 756, a check is made to determine if the desired design is a fin-based design. If so, then the process proceeds to step 758 where label replacement may be performed. Various labels are used in design rules checking (DRC) and Layout Versus Schematics (LVS) checking. In some cases, a standard nomenclature may be used. For example, "RX" may be used to indicate an active silicon area. During the conversion of a Pcell design from planar to quantized, various quantization labels may be generated to indicate a quantized value (e.g. "RXQ" for a quantized active silicon area). For the purposes of DRC and LVS, the RXQ label and other quantized labels may be replaced with a standard label (the planar counterpart label), such that DRC and LVS processes that rely on a standardized label can properly function. If at process step 756 it is determined that the desired design is a planar design, then any labels pertaining to a fin-based design are removed. In process step 760, DRC and LVS processes are performed. In process step 762, a stream file output is generated, which may be in the format of GDSII, OASIS, or other suitable format.

In various embodiments, design tools can be provided and configured to create the datasets used to pattern the semiconductor layers as described herein. For example, data sets can be created to generate photomasks used during lithography operations to pattern the layers for structures as described herein. Such design tools can include a collection of one or more modules and can also include hardware, software, or a combination thereof. Thus, for example, a tool can be a collection of one or more software modules, hardware modules, software/hardware modules, or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, application-specific integrated circuits (ASIC), programmable logic arrays (PLA)s, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method for adapting a planar design to a planar design integrated with fin-based design criteria, comprising:
    receiving width and local interconnect information for a planar region;
    generating a smart Pcell, wherein the smart Pcell contains information for the planar design and a fin-based design;
    receiving a fin pitch value;
    using a computer to compute a quantized region width for a quantized region, based on the received width information and the fin pitch value;
    generating a quantization label for the quantized region;
    performing a check to determine a desired design type, and in response to determination of a fin-based design, replacing the quantization label with a standard label;
    computing a quantized local interconnect region width based on the fin pitch value; and
    generating a stream format indicative of the desired design type, wherein the desired design type includes one of planar design, and fin-based design.

2. The method of claim 1, wherein receiving width information for a planar region comprises receiving an active area region width, and wherein computing a quantized region width comprises computing a quantized active area width as a multiple of the fin pitch value.

3. The method of claim 2, wherein computing a quantized active area width as a multiple of the fin pitch value comprises computing a quantized region width equivalent to the largest multiple of the fin pitch value that is less than or equal to the planar region width.

4. The method of claim 2, wherein computing quantized active area width as a multiple of the fin pitch value comprises computing a quantized region width equivalent to the smallest multiple of the fin pitch value that is greater than or equal to the planar region width.

5. The method of claim 2, further comprising overriding a default quantized region width.

6. A system for implementing a parameterized cell, comprising one or more processors coupled to non-transitory memory containing machine instructions, that when executed by the one or more processors, perform the functions of:
    receiving width and local interconnect information for a planar region;
    generating a smart Pcell, wherein the smart Pcell contains information for the planar design and a fin-based design;
    receiving a fin pitch value; and
    computing a quantized region width for a quantized region, based on the received width information and the fin pitch value;
    generating a quantization label for the quantized region;
    performing a check to determine a desired design type, and in response to the determination of a fin-based design, replacing the quantization label with a standard label;
    computing a quantized local interconnect region width based on the fin pitch value; and
    generating a stream format indicative of the desired design type, wherein the desired design type includes one of planar design, and fin-based design.

7. The system of claim 6, wherein the non-transitory memory further comprises instructions, that when executed by the one or more processors, perform a function of computing a quantized active area width.

8. The system of claim 7, wherein the non-transitory memory further comprises instructions, that when executed by the one or more processors, perform a function of computing a quantized region width equivalent to the largest multiple of the fin pitch that is less than or equal to the planar region width.

9. The system of claim 7, wherein the non-transitory memory further comprises instructions, that when executed by the one or more processors, perform a function of computing a quantized region width equivalent to the smallest multiple of the fin pitch that is greater than or equal to the planar region width.

10. The system of claim 7, wherein the non-transitory memory further comprises instructions, that when executed by the one or more processors, perform a function of enabling an override of a default quantized region width.

11. A computer program product embodied in a non-transitory computer-readable medium for adapting a planar design to a fin-based design comprising:
    instructions for receiving width information and local interconnect information for a planar region;
    instructions for generating a smart Pcell, wherein the smart Pcell contains information for the planar design and a fin-based design;
    instructions for receiving a fin pitch value; and
    instructions for computing a quantized region width for a quantized region, based on the received width information and the fin pitch value;
    instructions for generating a quantization label for the quantized region;
    instructions for performing a check to determine a desired design type and, in response to the determination of a fin-based design, replacing the quantization label with a standard label;
    computing a quantized local interconnect region width based on the fin pitch value; and
    instructions for generating a stream format indicative of the desired design type, wherein the desired design type includes one of planar design, and fin-based design.

12. The computer program product of claim 11, further comprising instructions for computing a quantized region width equivalent to the largest multiple of the fin pitch value that is less than or equal to the planar region width.

13. The computer program product of claim 11, further comprising instructions for comp uting a quantized region width equivalent to the smallest multiple of the fin pitch value that is greater than or equal to the planar region width.

14. The computer program product of claim 12, further comprising instructions for generating a warning when a difference between the planar region width and the quantized region width exceeds a predetermined threshold.

* * * * *